United States Patent
Wang et al.

(10) Patent No.: US 10,659,215 B1
(45) Date of Patent: May 19, 2020

(54) TRAINING AND TRACKING OF DDR MEMORY INTERFACE STROBE TIMING

(71) Applicant: Xilinx, Inc., San Jose, CA (US)

(72) Inventors: Xiaobao Wang, Cupertino, CA (US); Arvind R. Bomdica, Palo Alto, CA (US); Balakrishna Jayadev, San Jose, CA (US); Richard W. Swanson, San Jose, CA (US)

(73) Assignee: XILINX, INC., San Jose, CA (US)

( * ) Notice: Subject to any disclaimer, the term of this patent is extended or adjusted under 35 U.S.C. 154(b) by 59 days.

(21) Appl. No.: 16/135,653

(22) Filed: Sep. 19, 2018

(51) Int. Cl.
| | | |
|---|---|---|
| *G11C 7/00* | (2006.01) | |
| *G11C 11/00* | (2006.01) | |
| *H04L 7/00* | (2006.01) | |
| *G11C 7/22* | (2006.01) | |
| *H03L 7/081* | (2006.01) | |
| *G11C 7/10* | (2006.01) | |
| *G11C 29/50* | (2006.01) | |

(52) U.S. Cl.
CPC .......... *H04L 7/0041* (2013.01); *G11C 7/1084* (2013.01); *G11C 7/1087* (2013.01); *G11C 7/1093* (2013.01); *G11C 7/222* (2013.01); *H03L 7/0814* (2013.01); *G11C 7/109* (2013.01); *G11C 29/50012* (2013.01); *G11C 2207/107* (2013.01); *G11C 2207/2254* (2013.01)

(58) Field of Classification Search
CPC .. G11C 7/00; G11C 8/00; G11C 7/222; G11C 29/023; G11C 7/1012; G11C 11/4076; G11C 7/22; G11C 11/4096; G11C 29/022; G11C 7/1087; G11C 2207/107; G11C 16/08; G11C 7/02; G06F 1/12; G06F 12/00; G06F 13/00; G06F 13/28; G06F 13/42; H04L 5/00; H04L 7/00
See application file for complete search history.

(56) References Cited

U.S. PATENT DOCUMENTS

| | | | |
|---|---|---|---|
| 6,940,768 B2 | 9/2005 | Dahlberg et al. | |
| 7,443,741 B2 | 10/2008 | Butt et al. | |
| 7,567,104 B2 | 7/2009 | Ku et al. | |
| 8,134,878 B1* | 3/2012 | Shimanek | ........ H03K 19/17736 365/194 |
| 8,611,159 B1* | 12/2013 | Sasaki | .................. G11C 29/022 365/189.02 |

(Continued)

*Primary Examiner* — Hien N Nguyen
(74) *Attorney, Agent, or Firm* — Craige Thompson, Thomspon Law Group

(57) ABSTRACT

Methods and apparatus relate to a 1-to-2 memory interface deserializer circuit that, in a training mode, independently positions even and odd strobes in respective even and odd data windows. In an illustrative example, the deserializer circuit may receive a data signal that encodes even and odd data streams on the rising (even) and falling (odd) edges of a strobe clock signal. During a training mode, the deserializer circuit may independently determine, for example, an optimal temporal delay for each of the even strobe and the odd strobe. Adjustable delay lines dedicated to each of the even and odd strobe signals may simultaneously detect valid data window edges to permit determination of a desired delay to optimally position the strobe signals. Various embodiments may advantageously reduce jitter associated with asymmetric strobe and/or data signals to achieve a predetermined specification (e.g., timing margins) within the corresponding data windows.

20 Claims, 12 Drawing Sheets

(56) References Cited

U.S. PATENT DOCUMENTS

2010/0014364 A1\* 1/2010 Laberge .................. G11C 5/02
365/193
2015/0302905 A1\* 10/2015 Lee ..................... G06F 13/1689
711/105

\* cited by examiner

TRAINING AND TRACKING OF DDR MEMORY INTERFACE STROBE TIMING

TECHNICAL FIELD

Various embodiments relate generally to strobe timing of double date rate (DDR) memory interfaces.

BACKGROUND

Double Data Rate memory (DDR memory) is a type of Random Access Memory (RAM) that uses both the rising and falling edges of a clock strobe signal. As such, DDR memory transfers data twice per clock strobe cycle. DDR memory may exchange data between one of various types of central processing units (CPUs) and a north bridge via, for example, a front-side bus.

"Set-up time" and "hold time" together describe the timing requirements on the data input of a sequential logic element, such as a flip-flop or register, with respect to a clock input. The set-up and hold times define a temporal window during which data must be stable to guarantee predictable performance over a full range of operating conditions and manufacturing tolerances. The set-up time is the length of time that data must be available and stable on the input terminal of a storage element before arrival of a clock edge for the data to be captured by the storage element; the hold time is the length of time that the data must remain stable after the arrival of the clock edge.

SUMMARY

Methods and apparatus relate to a 1-to-2 memory interface deserializer circuit that, in a training mode, independently positions even and odd strobes in respective even and odd data windows. In an illustrative example, the deserializer circuit may receive a data signal that encodes even and odd data streams on the rising (even) and falling (odd) edges of a strobe clock signal. During a training mode, the deserializer circuit may independently determine, for example, an optimal temporal delay for each of the even strobe and the odd strobe. Adjustable delay lines dedicated to each of the even and odd strobe signals may simultaneously detect valid data window edges to permit determination of a desired delay to optimally position the strobe signals. Various embodiments may advantageously reduce jitter associated with asymmetric strobe and/or data signals to achieve a predetermined specification (e.g., timing margins) within the corresponding data windows.

Various embodiments may achieve one or more advantages. For example, some embodiments may separately optimize strobe placement within substantially unequal data-valid windows as may exist in various double data rate memory (DDR memory) interfaces. For example, separate optimization of odd and even data strobe placement may advantageously reduce jitter in deserialized data streams, thereby extending data bandwidth and/or signal integrity and system performance (e.g., in terms of eye diagram characteristics). In accordance with the described embodiments herein, some embodiments may consume less space, for example, because they need to occupy a reduced area on an integrated circuit (IC) wafer. Similarly, some examples may consume less resources within configurable logic fabric. Various implementations may enable higher data rates in DDR interfaces without suffering increased data errors, for example, by optimally positioning the strobes in even and odd data windows. Some embodiments may advantageously operate at a reduced power. Various examples may, for example, independently generate the control signals to position the odd and even strobes, so that the various design criteria (e.g., setup margin, hold margin, bit error rate) may be flexibly optimized without the restriction that even bits and odd bits have identical delay or identical positioning specifications within the valid data window. Various embodiments may advantageously reduce jitter associated with asymmetric strobe and/or data signals by independently adjusting even and odd delays to position the even and odd strobes to achieve a predetermined specification (e.g., timing margins) within the corresponding even and odd data windows.

Advantages and benefits may also be found in the two-stage training and run-time architecture of various embodiments. During a training phase, a nominal delay may be determined to apply to substantially optimize the position of the strobes for even and odd data, respectively, using a known (e.g., pseudo-random) data sequence, for example. Then, after the training has been completed, run time operation can apply the nominal delay to live data, which has not been predetermined. Some implementations may advantageously permit deserialized even and odd data to be temporally synchronized, as an option.

In one exemplary aspect, a 1-to-2 memory interface deserializer apparatus includes a first adjustable delay line configured to delay a first strobe signal (DQST) in response to a ST delay control signal, and a second adjustable delay line configured to delay a second strobe signal (DQSC) in response to a SC delay control signal. The DQSC is substantially complementary to the DQST. An even flip-flop is coupled to receive a serial data stream (DQx), wherein the DQx has alternating even bits associated with an activating edge of the DQST, and odd bits associated with an activating edge of the DQSC. The apparatus further includes an odd flip-flop configured to sample the odd bits from the serial data stream in response to the activating edge of the delayed DQSC received from the second adjustable delay line, and a processor circuit operatively coupled to the even flip-flop, the odd flip-flop, and to the first and second adjustable delay lines. During a training mode, the processor circuit is configured to determine a temporal size and position of a valid data window for both of the sampled even bits and the sampled odd bits, respectively, and to generate the SC control signal and the ST control signal to selectively position the activating edge of the delayed DQST in the valid data window of the sampled even bits, and to selectively position the activating edge of the delayed DQSC in the valid data window of the sampled odd bits.

In various implementations the processor may be configured to independently generate the ST control signal and the SC control signal. A data input buffer operatively coupled to the even flip-flop and to the odd flip-flop and configured to receive the DQx. The processor circuit may be further configured to make the valid data window temporal size and position determinations relative to the strobe signal. The apparatus may further include a strobe input buffer coupled to receive the DQST and the DQSC, wherein the strobe input buffer comprises a differential buffer.

In some examples, the apparatus may further include an even synchronization flip-flop coupled to the even flip-flop and configured to sample the even bits in response to the activating edge of the delayed DQSC received from the second adjustable delay line. The processor circuit may be operatively coupled to the even flip-flop, which may further comprise the processor circuit coupled to the even synchronization flip-flop, and the processor circuit configured to monitor the even data bits may further include the processor circuit configured to receive the synchronized even bits from the even synchronization flip-flop. The received serial data stream may be generated from a double data rate (DDR) memory interface. The DQx may include a predetermined pseudo-random sequence, and the processor circuit may be further configured to determine whether a predetermined number of the sampled even data bits matches corresponding bits of the predetermined pseudo-random sequence.

In another exemplary aspect, a method of operating a 1-to-2 memory interface deserializer apparatus may include delaying, with a first adjustable delay line, a first strobe signal (DQST) in response to a ST delay control signal, and delaying, with a second adjustable delay line, a second strobe signal (DQSC) in response to a SC delay control signal, wherein the DQSC is substantially complementary to the DQST. The method may further include receiving, with an even flip-flop, a serial data stream (DQx). The DQx may include alternating even bits associated with an activating edge of the DQST, and odd bits associated with an activating edge of the DQSC. The method continues with sampling, with an odd flip-flop, the odd bits from the serial data stream in response to the activating edge of the delayed DQSC received from the second adjustable delay line and providing a processor circuit operatively coupled to the even flip-flop, the odd flip-flop, and to the first and second adjustable delay lines. During a training mode, the processor determines a temporal size and position of a valid data window for both of the sampled even bits and the sampled odd bits, respectively. The method further includes generating the SC control signal and the ST control signal to selectively position the activating edge of the delayed DQST in the valid data window of the sampled even bits, and to selectively position the activating edge of the delayed DQSC in the valid data window of the sampled odd bits.

In some embodiments of the method, the method may further include independently generating the ST control signal and the SC control signal. The method may include providing a data input buffer operatively coupled to the even flip-flop and to the odd flip-flop and configured to receive the DQx.

The method may further include determining, with the processor circuit, the valid data window temporal size and position determinations relative to the strobe signal. The method may also include providing a strobe input buffer coupled to receive the DQST and the DQSC, wherein the strobe input buffer comprises a differential buffer, or sampling, with an even synchronization flip-flop coupled to the even flip-flop, the even bits in response to the activating edge of the delayed DQSC received from the second adjustable delay line.

In some implementations, the processor circuit operatively coupled to the even flip-flop may further include the processor circuit coupled to the even synchronization flip-flop, and receiving, with the processor circuit, the synchronized even bits from the even synchronization flip-flop. The DQx may include a predetermined pseudo-random sequence, and the method may further include determining, with the processor circuit, whether a predetermined number of the sampled even data bits matches corresponding bits of the predetermined pseudo-random sequence.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

To aid understanding, this document is organized as follows. First, an exemplary programmable integrated circuit (IC) on which the disclosed circuits and processes may be implemented is briefly introduced with reference to FIG. 1. Second, with reference to FIGS. 2-10, the discussion turns to exemplary embodiments that illustrate a training block diagram, training timing diagrams and training processes, where training involves optimization by independently positioning of a strobe for even and odd data windows, respectively, by determining temporal positions of various data-valid windows boundaries in a double data rate memory (DDR memory) interface. Finally, with reference to FIGS. 11-12, the discussion turns to exemplary embodiments that illustrate a real-time tracking block diagram and a tracking process, where tracking involves independent temporal detection and placement adjustments to the timing of DDR memory data strobes in the even and odd data windows.

Figure 1:
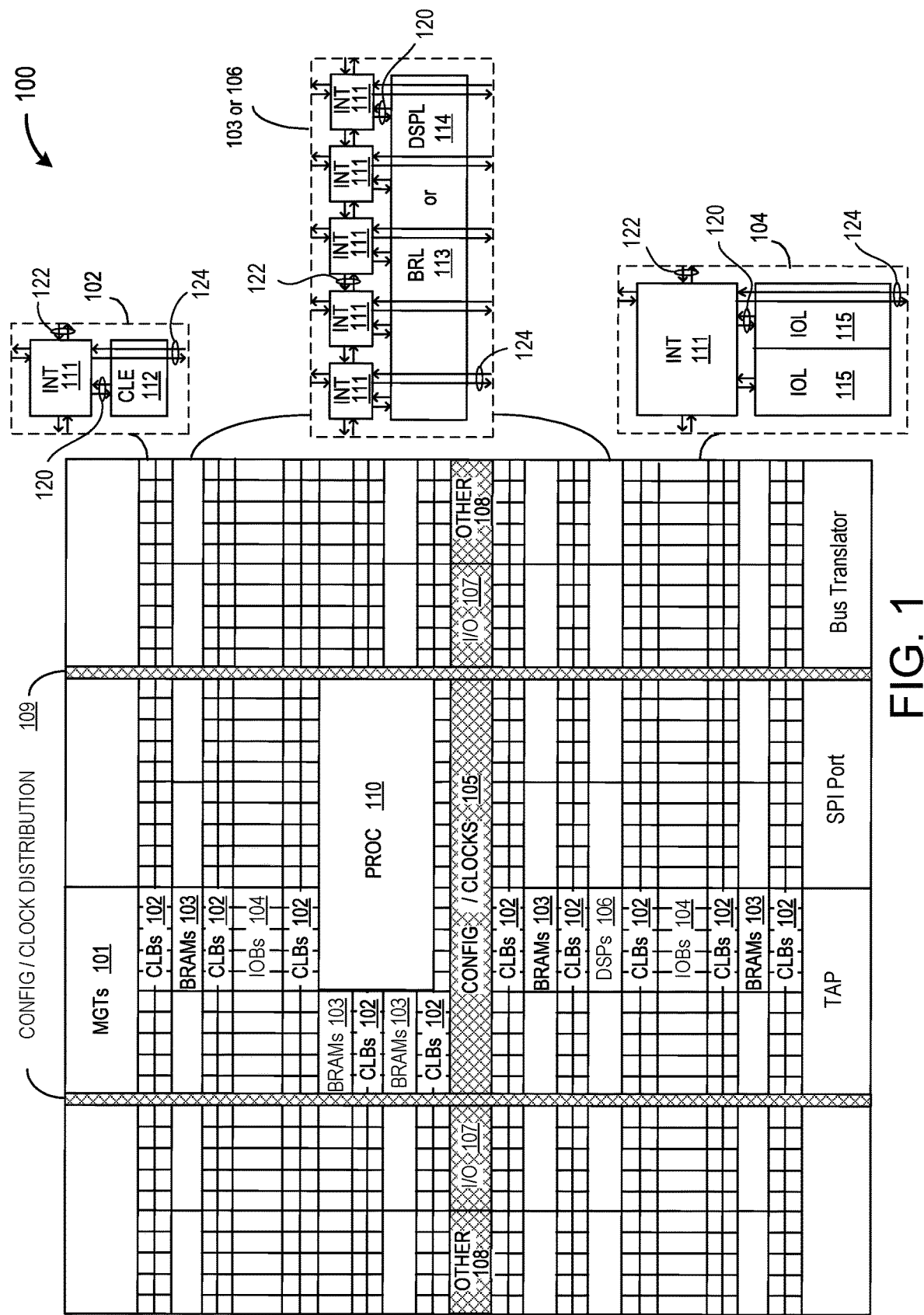
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs using the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Various examples of programmable ICs may include a memory interface, for example, a double data rate (DDR) memory interface. The DDR memory interfaces may include training and tracking circuits and/or methods that implement dynamically adjusted clock strobe delays that may improve the setup and hold time margins associated with reading and/or writing to a DDR memory.

Figure 2:
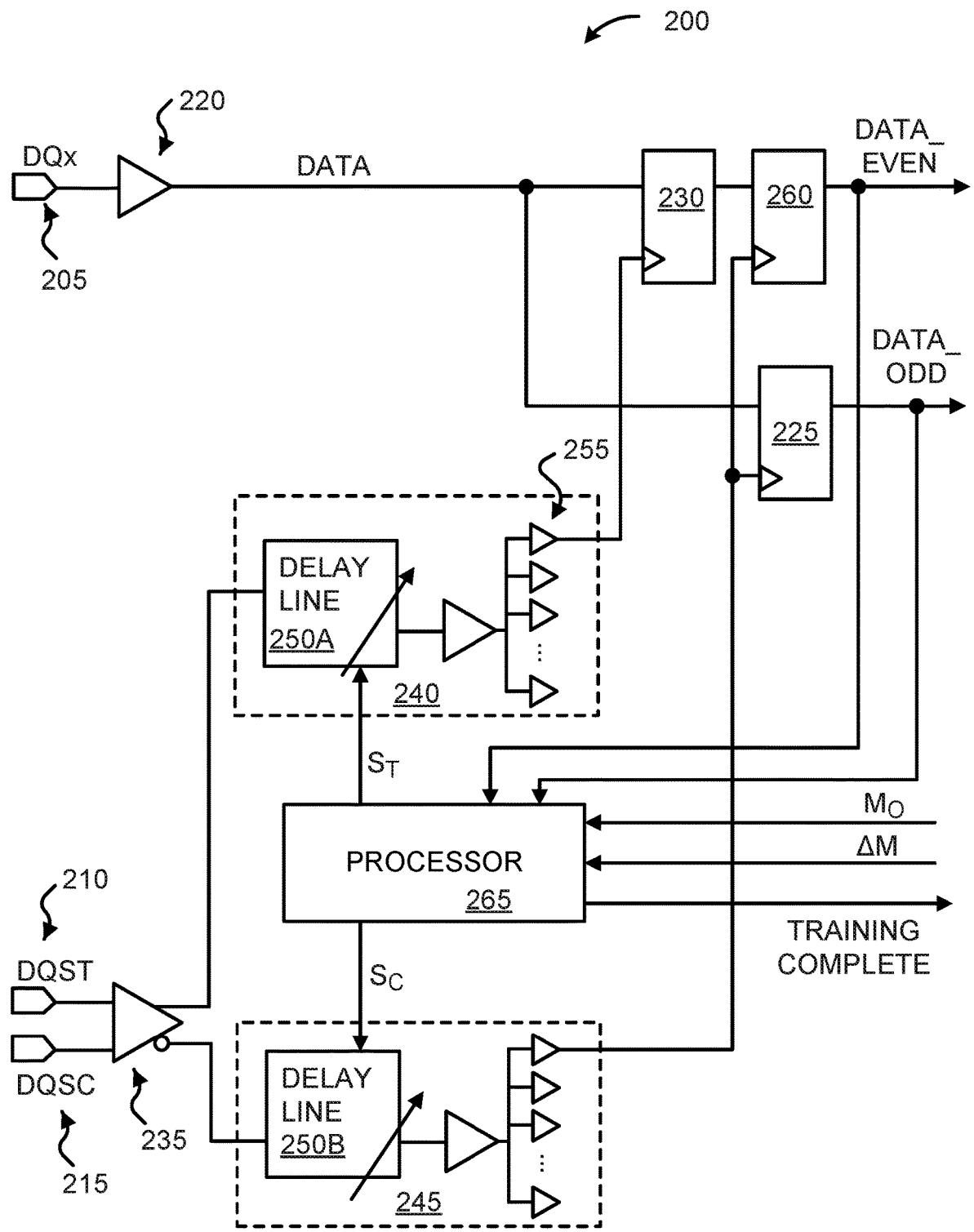
FIG. 2 depicts an exemplary 1-to-2 memory interface deserializer block.

FIG. 2 depicts an exemplary 1-to-2 memory interface deserializer block. A deserializer block 200 includes an input data pin (DQx) 205, a true strobe pin (DQST) 210 and a complementary strobe pin (DQSC) 215. The deserializer block 200 may be an interface for DDR memory, for example.

A receiver buffer 220 receives data from the input data pin (DQx) 205 and sends the data to a set of flip-flops 225 and 230. In the depicted example, there is no inserted delay from the output of the receiver buffer 220 to the set of flip-flops 225 and 230. The absence of the inserted delay may advantageously increase the speed and reduce the jitter of the deserializer block 200, as data is not processed through delay circuitry. The absence of the inserted delay may reduce overall power. The absence of the inserted delay may reduce required implementation area and/or may free up space and/or resources for other uses.

A differential buffer 235 receives the true strobe pin (DQST) 210 and the complementary strobe pin (DQSC) 215. The differential buffer 235 supplies a buffered true strobe to an adjustable delay clock distribution block (ADCDB) 240. Similarly, the differential buffer 235 supplies a buffered complementary strobe to an ADCDB 245. Each of the ADCDBs 240, 245 includes an adjustable delay line 250A, 250B. Each of the adjustable delay lines 250A, 250B feeds a clock buffer tree 255.

The ADCDB 245 clocks the flip-flop 225. The flip-flop 225 receives the data from the input data pin (DQx) 205. The data is clocked through the flip-flop 225 by a strobe output of the ADCDB 245 to produce a DATA_ODD signal. The ADCDB 240 clocks the flip-flop 230. The flip-flop 230 receives the data from the input data pin (DQx) 205. The data is clocked through the flip-flop 230 by a strobe output of the ADCDB 240. The output of the flip-flop 230 is sent to a cascaded flip-flop 260. The cascaded flip-flop 260 is clocked by the strobe output of the ADCDB 245 to produce a DATA_EVEN signal. In summary, the same data comes into the set of flip-flops 225, 230 and 260, and is qualified by a unique set of strobes to produce the DATA_EVEN and the DATA_ODD signals. Accordingly, the DATA_EVEN and DATA_ODD signals are the even and odd data bits deserialized from the serialized data on the output of the receive buffer 220. The set of flip-flops 225, 230 and 260 may be DDR capture flops. In some examples in which temporal alignment of DATA_EVEN and DATA_ODD is not required, the flip-flop 260 may be eliminated.

The deserializer block 200 includes a processor 265. The processor 265 is operable to adjust the delays in the ADCDBs 240 and 245 and to receive the DATA_EVEN and DATA_ODD signals. During a training phase, the processor 265 may determine a temporal size of a data-valid window for both odd and even data bits by determining the left and right edges of the data-valid windows. The processor 265 may then independently control a delay for each of the output strobes of the ADCDBs 240 and 245 in order to place them at a respective predetermined optimal location, which may be, for example, in the center of their respective data-valid windows. The processor 265 may delay the output strobes of the ADCDBs 240 and 245 with a set of control signals ST and Sc. The set of control signals ST and Sc may include a tap number associated with selection of an output of each of the adjustable delay lines 250A, 250B in each of the ADCDBs 240, 245, respectively. In some examples, the tap number may determine a specific controllable delay from input to output of the adjustable delay lines 250A, 250B.

The processor 265 may signal an end of the training phase with the TRAINING COMPLETE signal. The TRAINING COMPLETE signal may be implemented in a tracking block and/or a tracking method to facilitate generation of an offset delay signal Mo and a delay change signal ΔM. The offset delay signal Mo and the delay change signal ΔM are employed by the processor 265 to keep the strobe outputs of the ADCDBs 240 and 245 substantially centered within their associated data-valid windows.

The processor 265 controls the delays lines within the ADCDBs 240 and 245 to sweep the edges of the DQST and DQSC signals through the data bit frames formed by the DATA signal on the output of the receiver buffer 220. The data bit frames may be data-valid windows D0, D1, D2 and D3 illustrated within the DQx signal in FIG. 3.

The processor 265 may be implemented using various methods. For example, the processor 265 may be implemented with a high-level description language (HDL). In various implementations, the deserializer block 200 and ancillary circuits may be configured with HDL. In some exemplary implementations, the processor 265 and other functionality of the deserializer block 200 may be physically implemented, for example, on a semiconductor substrate with preprogrammed instructions that may be implemented, for example, in HDL.

In some examples, a Dynamic Random-Access Memory (DRAM) may include a pseudo-random data pattern generator, which may be, at least in part, in the form of at least one sequence of stored data. The processor 265 may include the same pseudo-random data pattern generator. In this manner the processor 265 may know what data to expect from the DRAM. The data may be compared to determine strobe timing location inside specific data-valid windows (D0, D1, D2 D3). Further the processor 265 may read one or more serial bits in specific data-valid windows to gain confidence that the strobe is truly in the determined window, for example.

For example, the processor 265 may determine whether the strobed data is D1 or D2. The processor 265 may read, for example, a statistically significant number (e.g., 10, 100, or at least about 1000) bits at a specific strobe delay. Based on the unique pattern of pseudo-random data strobed in, the processor 265 may determine, for example, whether that strobe position yields valid data (e.g., less than a predetermined error rate threshold), and may further indicate in which window the strobe is located.

Figure 3:
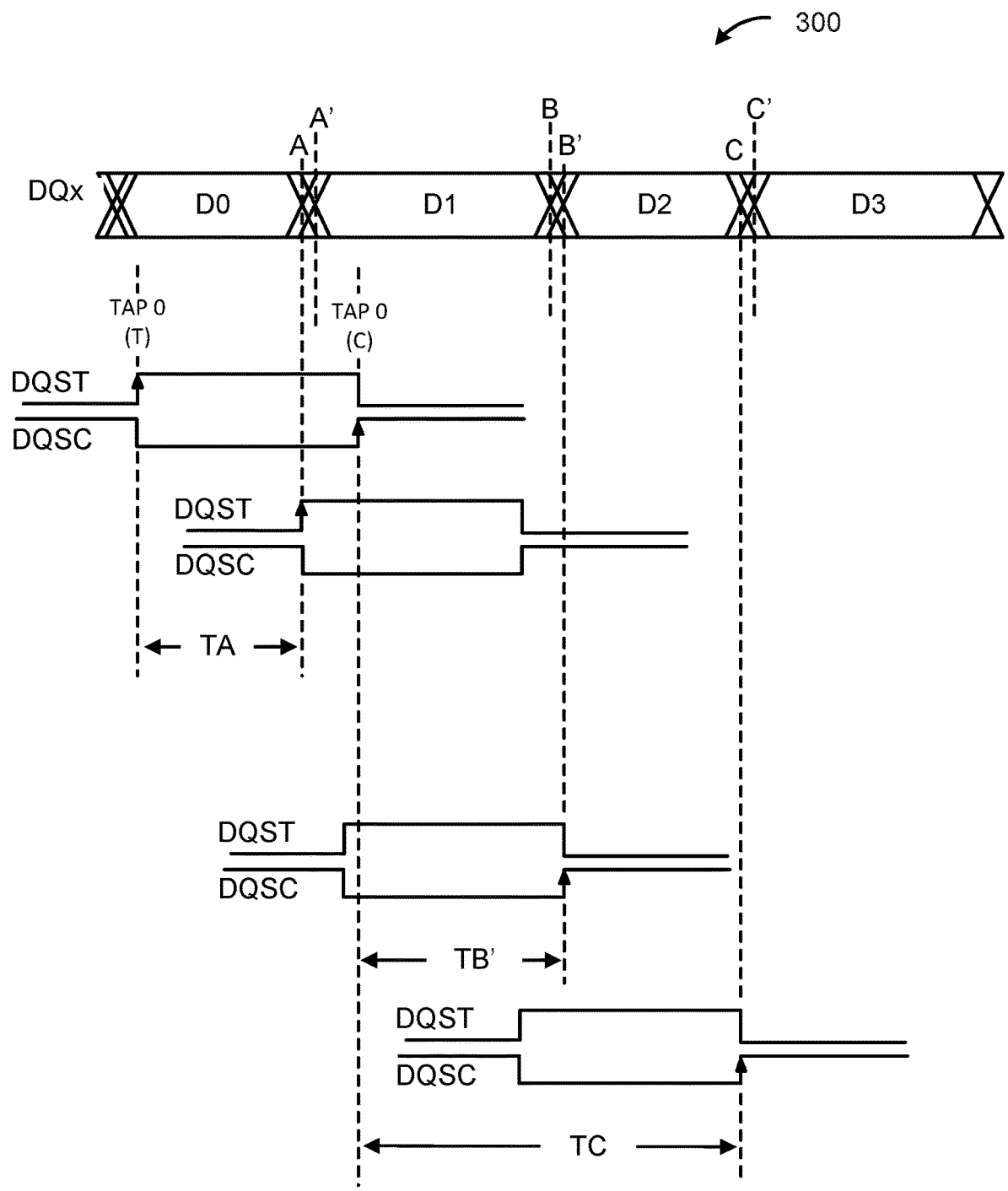
FIG. 3 depicts a timing diagram of an exemplary 1-to-2 memory interface deserializer block, illustrating a training phase to characterize an even data-valid window.

FIG. 3 depicts a timing diagram of an exemplary 1-to-2 memory interface deserializer block, illustrating a training phase to characterize an even data-valid window. A timing diagram 300 includes a serialized data signal DQx formed of alternating even data bits D0 and D2 and odd data bits D1 and D3.

In the exemplary timing diagram of FIG. 3 representing operation during a training phase, the signal timings may be used to determine the temporal width of the even data-valid window D2. The DQSC strobe is delayed such that its positive edge clocks in data D2. A search method (e.g., exhaustive, golden section, binary) may be executed to read D2 for each of one or more DQSC strobes of a given delay. When the D2 data read matches an expected D2 data pattern, the positive edge of the DQSC strobe is qualified as within the D2 data-valid window. Conversely, when the D2 data read does not match the expected D2 data pattern, the positive edge of the DQSC strobe is qualified as outside the D2 data-valid window. Using this method, the DQSC strobe may be delayed in a preprogrammed progression to search for the left side of the D2 data-valid window (B') and the right side of the D2 data-valid window (C). As in the depicted example of FIG. 3, the delay associated with the left side of the D2 data-valid window (B') is TB' and the delay associated with the right side of the D2 data-valid window (C) is TC. The difference represents the temporal width of the D2 data-valid window. Since all even data bits travel the same hardware path, the temporal width of all even data-valid windows can be characterized as:

$$T_{EVEN} = TC - TB'$$

In the exemplary timing diagram of FIG. 3, a training phase determines the time delay of the right side of the data-valid window D0. The DQST strobe is delayed such that its positive edge clocks in data D0. A search method may be executed to read D0 for each of one or more DQST strobes of a given delay. When the D0 data read matches an expected D0 data pattern, the positive edge of the DQST strobe is qualified as within the D0 data-valid window. Conversely, when the D0 data read does not match the expected D0 data pattern, the positive edge of the DQST strobe is qualified as outside the D0 data-valid window. Using this method, the DQST strobe may be delayed in a preprogrammed progression to search for the right side of the D0 data-valid window (A). As in the depicted example of FIG. 3, the DQST delay associated with the right side of the D0 data-valid window (A) is TA. The positive edge of the DQST strobe may be placed in the center of the D0 data-valid window by delaying the DQST strobe by:

$$TDELAY_{DQSC} = S_{T0} = TA - \frac{1}{2}(TC - TB')$$

In various implementations, the width of the D2 data-valid window may be determined using the DQST strobe, for example.

Figure 4:
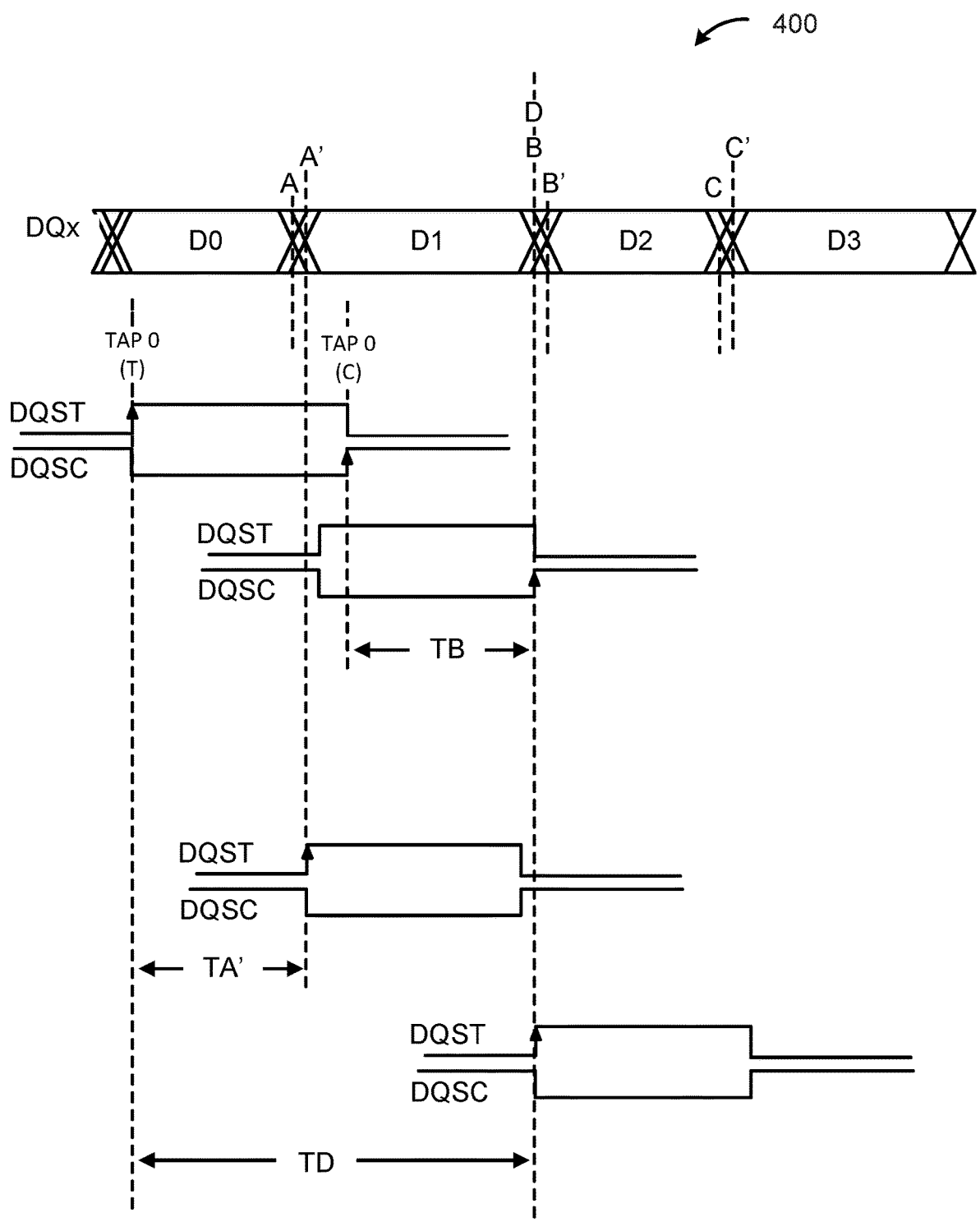
FIG. 4 depicts a timing diagram of an exemplary 1-to-2 memory interface deserializer block, illustrating a training phase to characterize an odd data-valid window.

FIG. 4 depicts a timing diagram of an exemplary 1-to-2 memory interface deserializer block, illustrating a training phase to characterize an odd data-valid window. A timing diagram 400 includes a serialized data signal DQx. The data signal DQx includes even data D0 and D2. The data signal DQx includes odd data D1 and D3.

In the exemplary timing diagram of FIG. 4 representing operation during a training phase, the signal timings may be used to determine the temporal width of the odd data-valid window D1. The DQST strobe is delayed such that its positive edge clocks in data D1. A search method may be executed to read D1 for each of one or more DQST strobes of a given delay. When the D1 data read matches an expected D1 data pattern, the positive edge of the DQST strobe is qualified as within the D1 data-valid window. Conversely, when the D1 data read does not match the expected D1 data pattern, the positive edge of the DQST strobe is qualified as outside the D1 data-valid window. Using this method, the DQST strobe may be delayed in a preprogrammed progression to search for the left side of the D1 data-valid window (A') and the right side of the D1 data-valid window (D). As in the depicted example of FIG. 4, the delay associated with the left side of the D1 data-valid window (A') is TA' and the delay associated with the right side of the D1 data-valid window (D) is TD. The difference represents the temporal width of the D1 data-valid window. Since all odd data bits travel the same hardware path, the temporal width of all odd data-valid windows can be characterized as:

$$T_{ODD} = TD - TA'$$

As in the depicted example of FIG. 4, the DQSC delay associated with the right side of the D1 data-valid window (B) is TB. The positive edge of the DQSC strobe may be placed in the center of the D1 data-valid window by delaying the DQSC strobe by:

$$TDELAY_{DQSC} = S_{C0} = TB - \frac{1}{2}(TD - TA')$$

In various implementations, the width of the D3 data-valid window may be determined using the DQSC strobe, for example.

Figure 5:
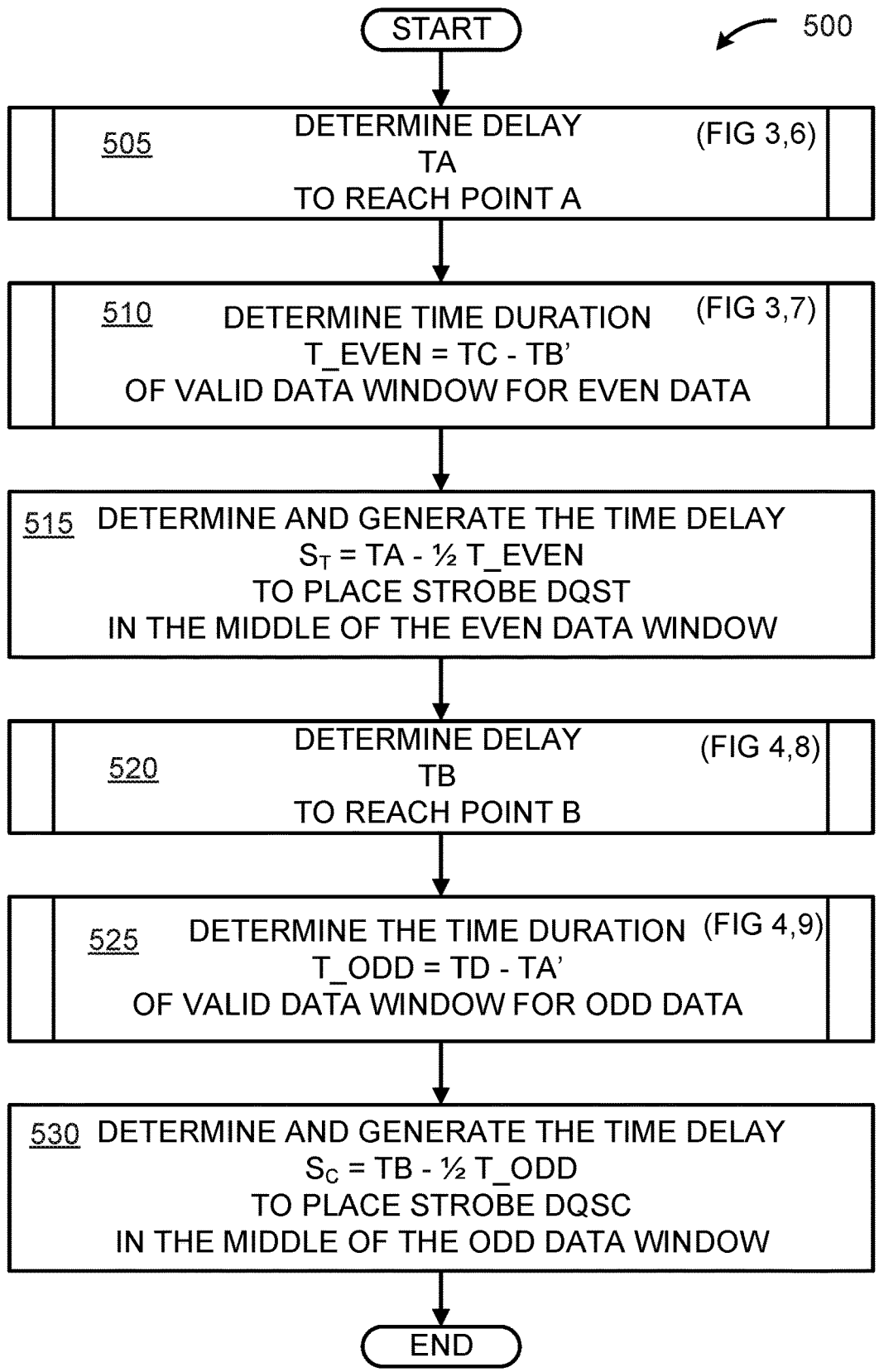
FIG. 5 depicts a flowchart of an exemplary training process.

FIG. 5 depicts a flowchart of an exemplary training process. A double data rate memory (DDR memory) interface strobe delay training process 500 begins at process block 505. At process block 505 the process 500 determines a DQST strobe delay TA. Delay TA may be, for example, delay TA with reference to FIG. 3. Various examples of process block 505 may include the process described with reference to FIG. 6, for example.

Following process block 505 is process block 510. At process block 510 the process 500 determines a temporal width of a data-valid window for an even data bit. The even data bit may be D2 with reference to FIG. 3, for example. Various examples of process block 510 may include the process described with reference to FIG. 7, for example. The temporal width of the data-valid window may be a data-valid window for even data and may be characterized as: $T_{EVEN}$=TC–TB' with reference to FIG. 3.

Following process block 510 is process block 515. At process block 515, process 500 determines a time delay (ST) for the DQST strobe to place it in the middle of the even data-valid window. The time delay ST may be:

$$S_T = TA - \frac{1}{2}T_{EVEN}$$

Following process block 515 is process block 520. At process block 520 the process 500 determines a DQSC strobe delay TB. Delay TB may be, for example, delay TB with reference to FIG. 4. Various examples of process block 520 may include the process described with reference to FIG. 8, for example.

Following process block 520 is process block 525. At process block 525 the process 500 determines a temporal width of a data-valid window for an odd data bit. The odd data bit may be D1 with reference to FIG. 4, for example. Various examples of process block 525 may include the process described with reference to FIG. 9, for example. The temporal width of the data-valid window may be a data-valid window for odd data and may be characterized as: $T_{ODD}$=TD–TA' with reference to FIG. 4.

Following process block 525 is process block 530. At process block 530, process 500 determines a time delay (Sc) for the DQSC strobe to place it in the middle of the odd data-valid window. The time delay Sc may be:

$$S_C = TB - \frac{1}{2}T_{ODD}$$

In some example processes, the process blocks 520, 525 and 530 may be executed before process blocks 505, 510 and 515. In some example processes, the process blocks 520, 525 and 530 may be executed at the same time as process blocks 505, 510 and 515. In some example processes, the process blocks 505 and 510 may execute in opposite order. In some example processes, the process blocks 520 and 525 may execute in opposite order.

The training process 500 may modulate the strobe delays using various methods. For example, the strobe delay modulation may be a linear sweep. The linear sweep may increment the strobe delay one tap at a time. In some instances, the linear sweep may decrement the strobe delay one tap at a time.

In some examples, the strobe delay modulation may be a binary search. For example, an initial strobe delay may be incremented to half of a total delay modulation range. Next, data is strobed in. If the received data is not the expected data, the strobe delay may be decrement to half of the previous delay change. This process may be iterated to perform the binary search. The binary search may advantageously attain a result faster than a linear sweep, for example.

Figure 6:
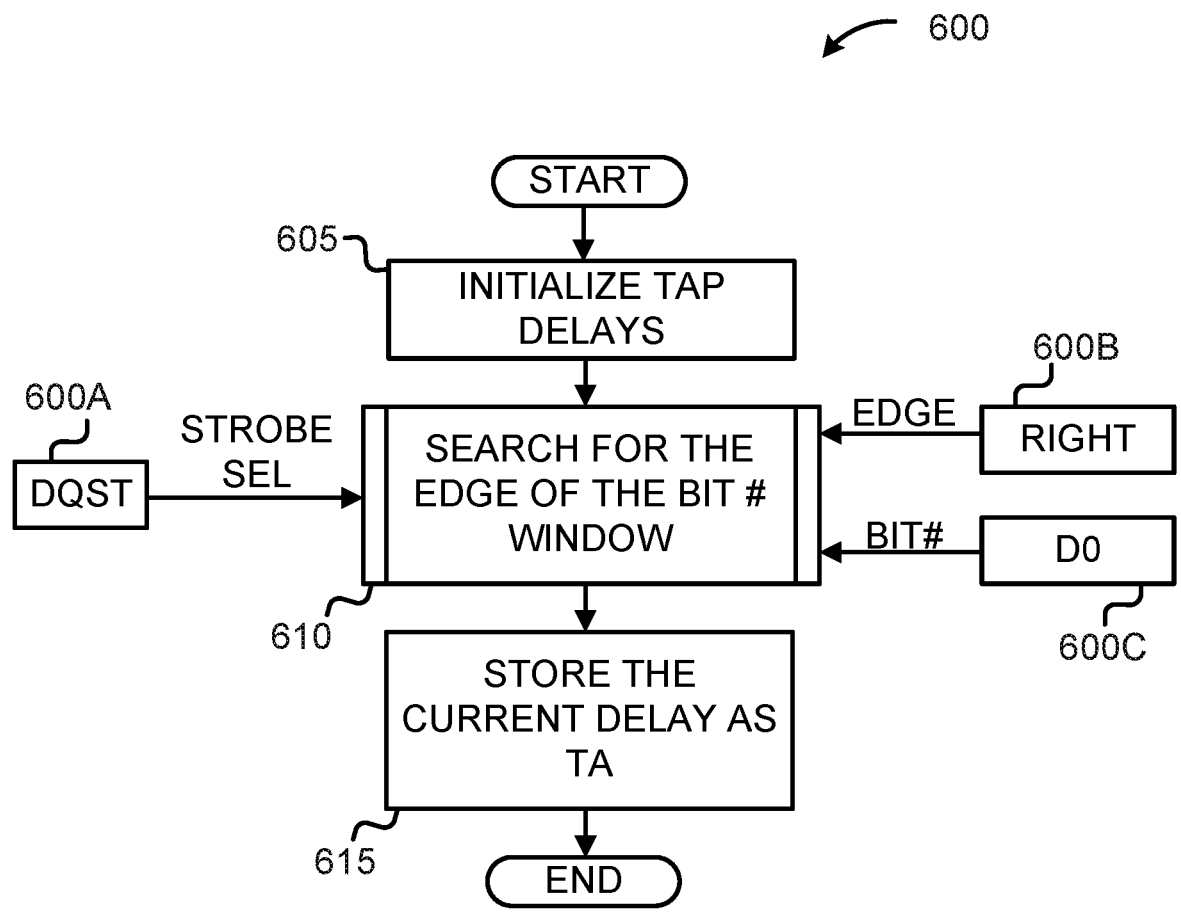
FIG. 6 depicts a flowchart of an exemplary training process.

FIG. 6 depicts a flowchart of an exemplary training process. In the depicted example, an exemplary flowchart 600 may be a delay determination process, such as the delay determination processes 505 (FIG. 5). The exemplary flowchart 600 may describe a process which determines a delay TA as described with reference to FIG. 3. Specifically, the exemplary flowchart 600 and may determine when a DQST strobe select 600A is delayed to a right edge 600B of a D0 data-valid window 600C. The DQST strobe select 600A may be the DQST strobe with reference to FIG. 3. The right edge 600B of the D0 data-valid window 600C may be the time point A with reference to FIG. 3.

The exemplary flowchart 600 describing the delay determination process begins at process block 605. At process block 605, the tap delays are initialized. In some examples, the delays may be initialized to zero (e.g., no delay, tap 0). Next, the delay determination process executes process block 610. At process block 610, the delay determination process searches for the edge of the bit number window. The search may be executed by delaying the DQST strobe select 600A strategically and reading back the expected D0 data from the D0 data-valid window 600C. Examples of search processes that may be suitable for some embodiments are described, for example, with reference to FIG. 10. Once the DQST strobe select 600A is delayed to the right edge 600B of the D0 data-valid window 600C, the delay determination process executes process block 615. At process block 615, the delay determination process stores the current delay to memory (e.g., variable TA). The delay determination process is then exited.

Figure 7:
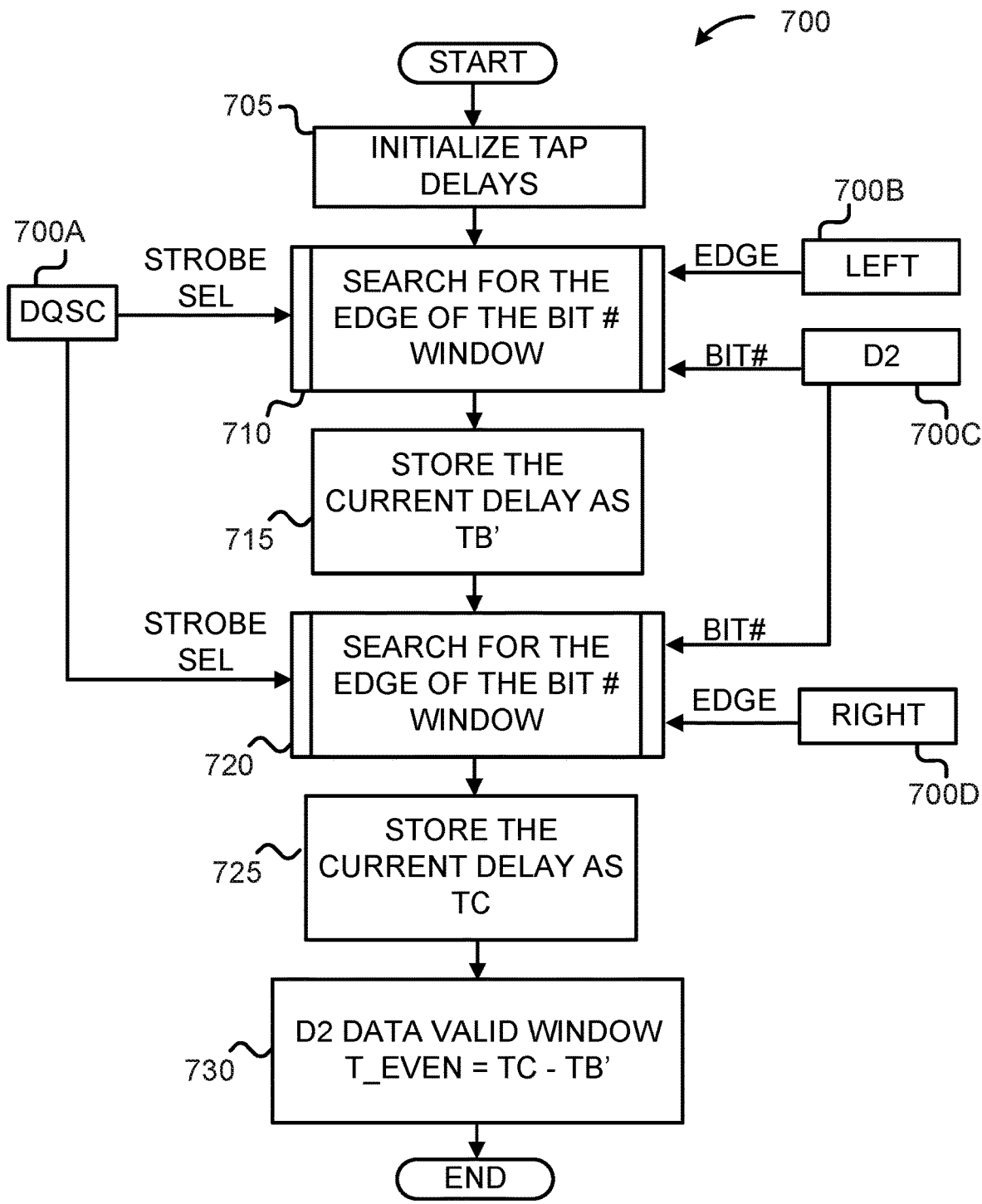
FIG. 7 depicts a flowchart of an exemplary training process.

FIG. 7 depicts a flowchart of an exemplary training process. In the depicted example, an exemplary flowchart 700 may be a data-valid window time duration determination process, such as the time duration determination processes 510 (FIG. 5). The exemplary flowchart 700 may describe a process which determines a duration of the D2 data-valid window (e.g., from time point B' to time point C) as described with reference to FIG. 3.

Specifically, the exemplary flowchart 700 may determine when a DQSC strobe select 700A is delayed to a left edge 700B and to a right edge 700D of a D2 data-valid window 700C. The DQSC strobe select 700A may be the DQSC strobe with reference to FIG. 3. The left edge 700B of the D2 data-valid window 700C may be the time point B' with reference to FIG. 3. The right edge 700D of the D2 data-valid window 700C may be the time point C with reference to FIG. 3. The exemplary flowchart 700 may then find the time difference between the left edge 700B and the right edge 700D to determine the overall duration of the D2 data-valid window.

The exemplary flowchart 700 describing the duration determination process begins at process block 705. At process block 705, the tap delays are initialized. In some examples, the delays may be initialized to zero (e.g., no delay, tap 0). Next, the delay determination process executes process block 710. At process block 710, the delay determination process searches for the edge of the bit number window. The search may be executed by delaying the DQSC strobe select 700A strategically and reading back the expected D2 data from the D2 data-valid window 700C. Examples of search processes that may be suitable for some embodiments are described, for example, with reference to FIG. 10. Once the DQSC strobe select 700A is delayed to the left edge 700B of the D2 data-valid window 700C, the delay determination process executes process block 715. At process block 715, the delay determination process stores the current delay to memory (e.g., variable TB').

The exemplary flowchart 700 then executes process block 720. At process block 720, the delay determination process searches for the edge of the bit number window. The search may be executed by delaying the DQSC strobe select 700A strategically and reading back the expected D2 data from the D2 data-valid window 700C. Examples of search processes that may be suitable for some embodiments are described, for example, with reference to FIG. 10. Once the DQSC strobe select 700A is delayed to the right edge 700D of the D2 data-valid window 700C, the delay determination process executes process block 725. At process block 725, the delay determination process stores the current delay to memory (e.g., variable TC). Execution then jumps to process block 730.

At process block 730, the delay determined at process block 710 (e.g., B') is subtracted from the delay determined at process block 720 (e.g., C). The result is saved to memory as an even data-valid window (e.g., $T_{EVEN}$). The duration determination process is then exited.

In various examples, various process blocks may be executed in a different order. For example, the variable TC may be determined before the variable TB', which may exchange process blocks 710 and 715 with process blocks 720 and 725, respectively.

Figure 8:
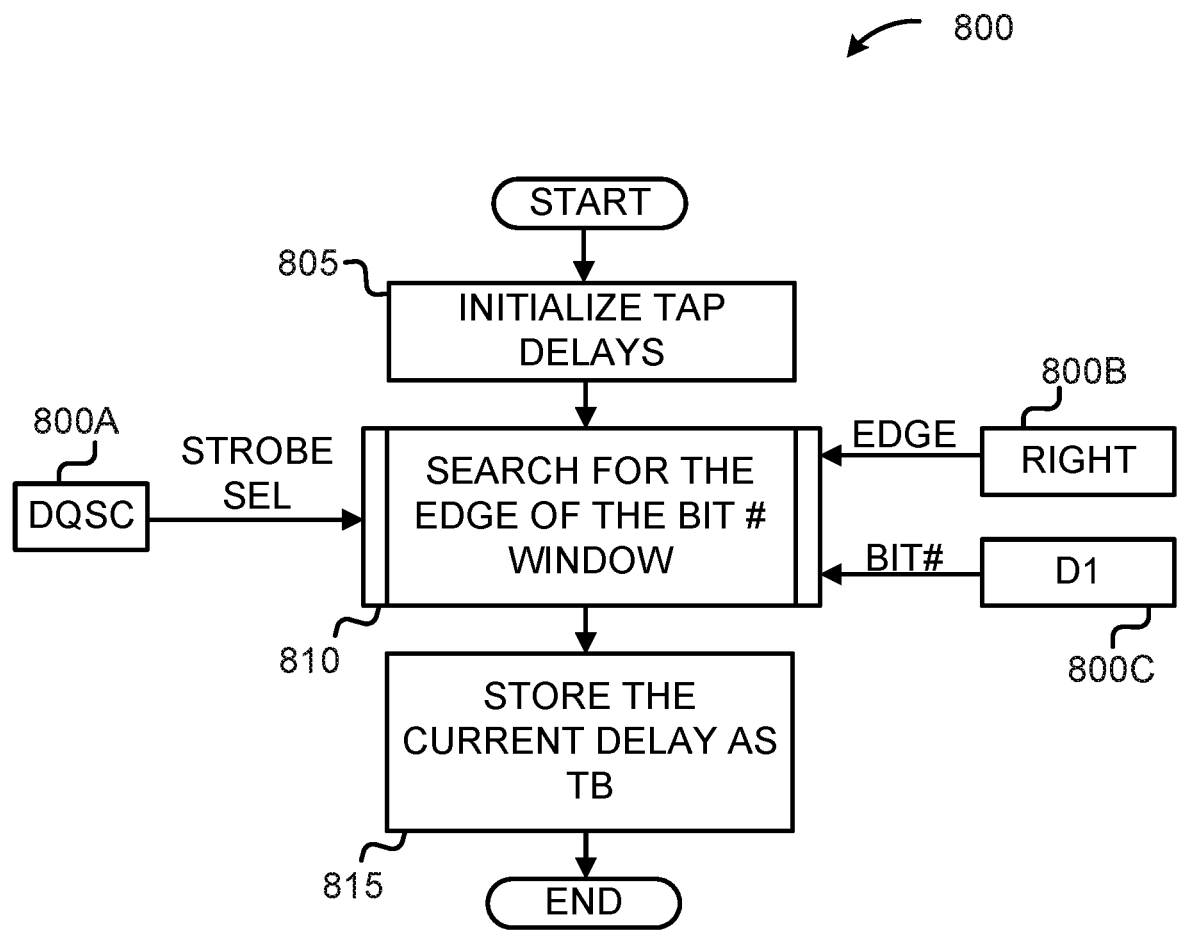
FIG. 8 depicts a flowchart of an exemplary training process.

FIG. 8 depicts a flowchart of an exemplary training process. In the depicted example, an exemplary flowchart 800 may be a delay determination process, such as the delay determination processes 520 (FIG. 5). The exemplary flowchart 800 may describe a process which determines a delay TB as described with reference to FIG. 4. Specifically, the exemplary flowchart 800 and may determine when a DQSC strobe select 800A is delayed to a right edge 800B of a D1 data-valid window 800C. The DQSC strobe select 800A may be the DQSC strobe with reference to FIG. 4. The right edge 800B of the D1 data-valid window 800C may be the time point B with reference to FIG. 4.

The exemplary flowchart 800 describing the delay determination process begins at process block 805. At process block 805 the tap delays are initialized. In some examples, the delays may be initialized to zero (e.g., no delay, tap 0). Next, the delay determination process executes process block 810. At process block 810, the delay determination process searches for the edge of the bit number window. The search may be executed by delaying the DQSC strobe select 800A strategically and reading back the expected D1 data from the D1 data-valid window 800C. Examples of search processes that may be suitable for some embodiments are described, for example, with reference to FIG. 10. Once the DQSC strobe select 800A is delayed to the right edge 800B of the D1 data-valid window 800C, the delay determination process executes process block 815. At process block 815, the delay determination process stores the current delay to memory (e.g., variable TB). The delay determination process is then exited.

Figure 9:
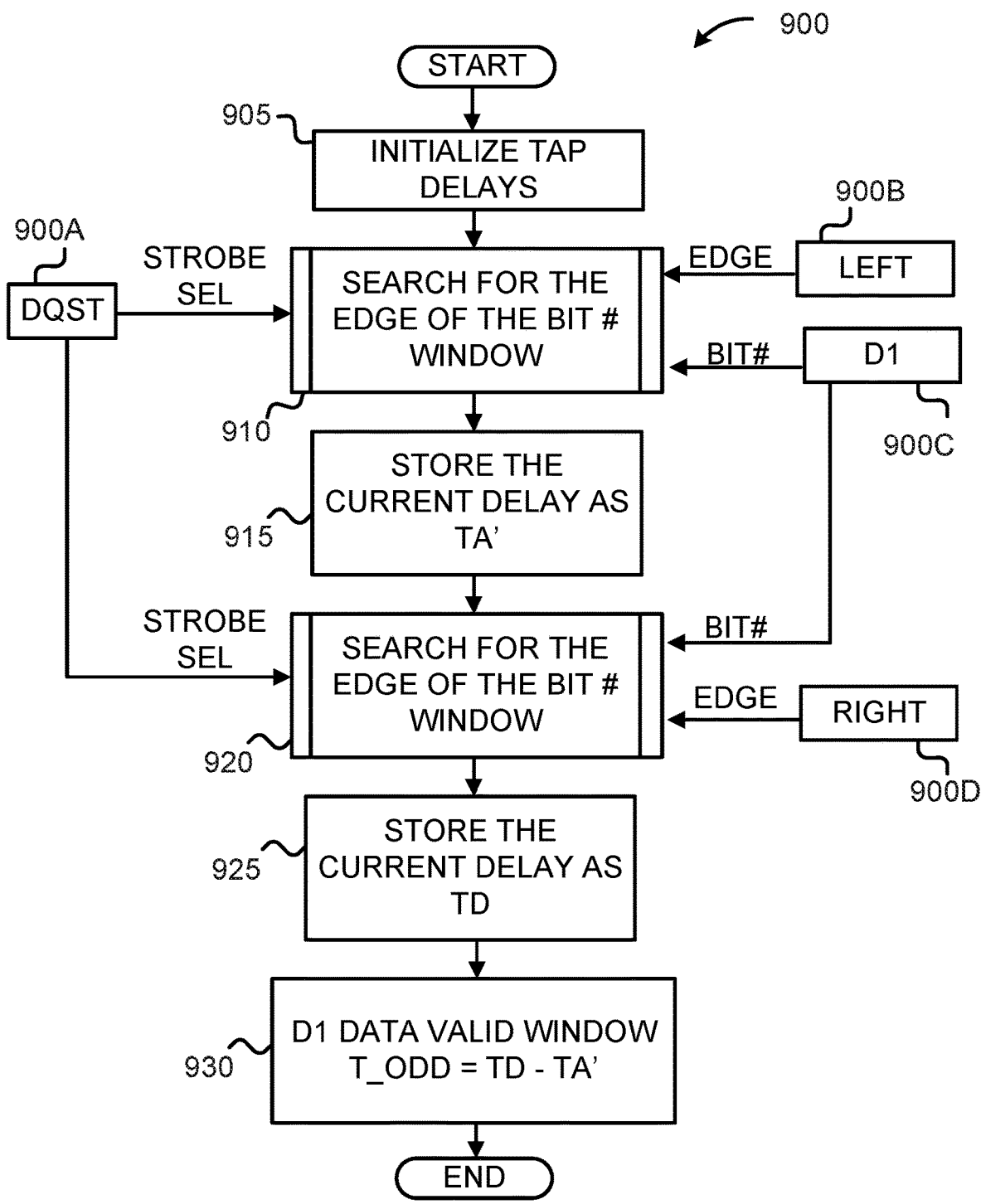
FIG. 9 depicts a flowchart of an exemplary training process.

FIG. 9 depicts a flowchart of an exemplary training process. In the depicted example, an exemplary flowchart 900 may be a data-valid window time duration determination process, such as the time duration determination processes 525 (FIG. 5). The exemplary flowchart 900 may describe a process which determines a duration of the D1 data-valid window (e.g., from time point A' to time point D) as described with reference to FIG. 4.

Specifically, the exemplary flowchart 900 may determine when a DQST strobe select 900A is delayed to a left edge 900B and to a right edge 900D of a D1 data-valid window 900C. The DQST strobe select 900A may be the DQST strobe with reference to FIG. 4. The left edge 900B of the D1 data-valid window 900C may be the time point A' with reference to FIG. 4. The right edge 900D of the D1 data-valid window 900C may be the time point D with reference to FIG. 4. The exemplary flowchart 900 may then find the time difference between the left edge 900B and the right edge 900D to determine the overall duration of the D1 data-valid window.

The exemplary flowchart 900 describing the duration determination process begins at process block 905. At process block 905 the tap delays are initialized. In some examples, the delays may be initialized to zero (e.g., no delay, tap 0). Next, the delay determination process executes process block 910. At process block 910, the delay determination process searches for the edge of the bit number window. The search may be executed by delaying the DQST strobe select 900A strategically and reading back the expected D1 data from the D1 data-valid window 900C. Examples of search processes that may be suitable for some embodiments are described, for example, with reference to FIG. 10. Once the DQST strobe select 900A is delayed to the left edge 900B of the D1 data-valid window 900C, the delay determination process executes process block 915. At process block 915, the delay determination process stores the current delay to memory (e.g., variable TA').

The exemplary flowchart 900 then executes process block 920. At process block 920, the delay determination process searches for the edge of the bit number window. The search may be executed by delaying the DQST strobe select 900A strategically and reading back the expected D1 data from the D1 data-valid window 900C. Examples of search processes that may be suitable for some embodiments are described, for example, with reference to FIG. 10. Once the DQST strobe select 900A is delayed to the right edge 900D of the D1 data-valid window 900C, the delay determination process executes process block 925. At process block 925, the delay determination process stores the current delay to memory (e.g., variable TD). Execution then jumps to process block 930.

At process block 930, the delay determined at process block 910 (e.g., A') is subtracted from the delay determined at process block 920 (e.g., D). The result is saved to memory as an odd data-valid window (e.g., $T_{ODD}$). The duration determination process is then exited.

In various examples, the process blocks may be executed in a different order. For example, the variable TD may be determined before the variable TA', which may exchange process blocks 910 and 915 with process blocks 920 and 925, respectively.

Figure 10:
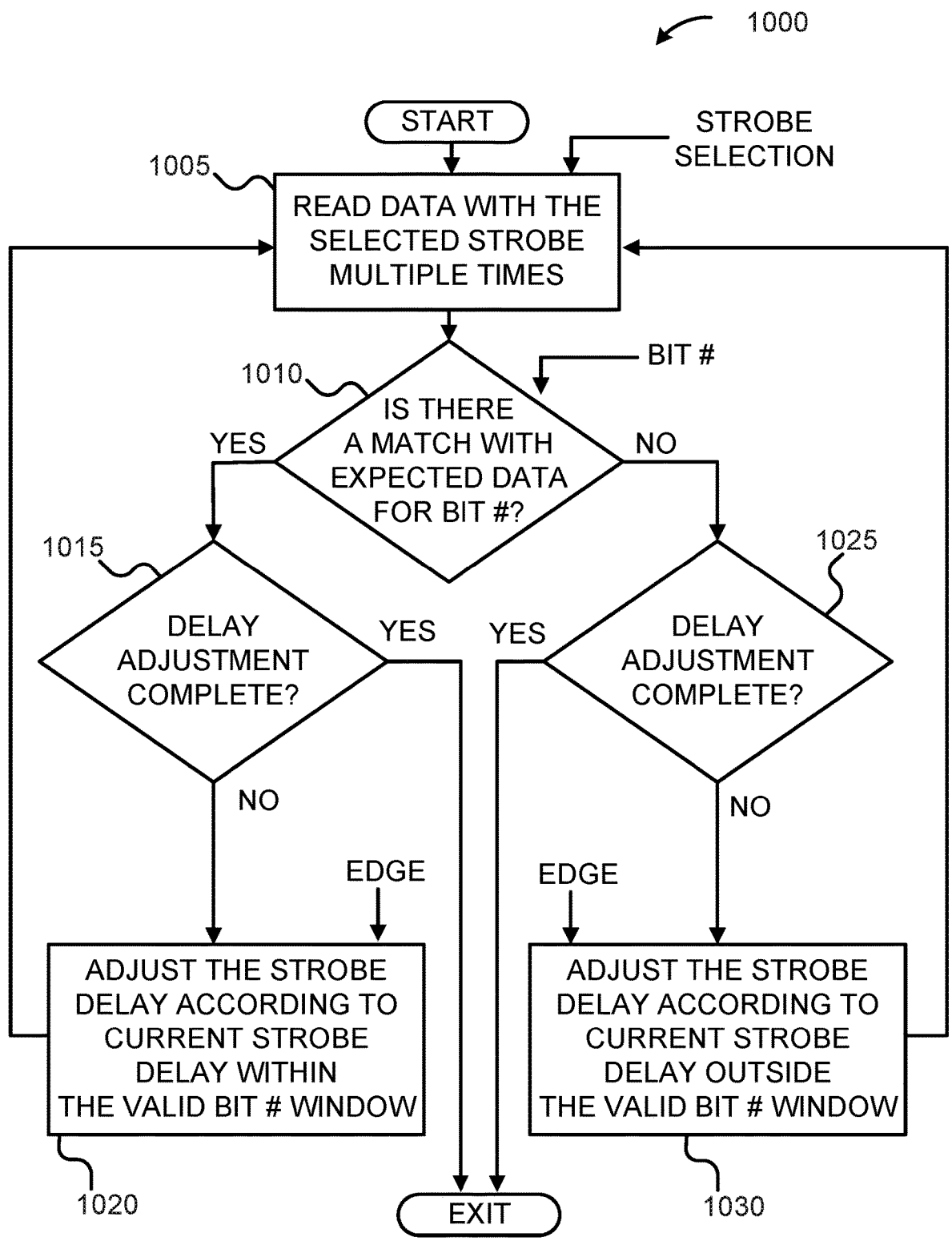
FIG. 10 depicts a flowchart of an exemplary training search process.

FIG. 10 depicts a flowchart of an exemplary training search process. A search process 1000 begins at process block 1005. At process block 1005 a strobe selection is received, for example, DQSC strobe select 700A (FIG. 7) or DQST strobe select 900A (FIG. 9). At process block 1005 data associated with the selected strobe is read in multiple times.

Multiple in this instance may refer to a training process where a predetermined pattern of data is written to a DDR memory interface. The pattern may include multiple nibbles, bytes and/or words. The pattern may be known by the search process 1000. For example, the predetermined pattern may include a known pattern of D1 and D2 data bits that can be compared with the data associated with the selected strobe that is read in multiple times. Successful comparisons may indicate that the selected strobe is inside the D1 and/or D2 data-valid window. Accordingly, failed comparisons may indicate that the selected strobe is outside the D1 and/or D2 data-valid window.

From process block 1005, execution continues to decision block 1010. At decision block 1010, a bit number is received, for example, bit D2 from the D2 data-valid window 700C (FIG. 7) or bit D1 from the D1 data-valid window 900C (FIG. 9). The bit number received may indicate what data bit is expected to be strobed in. At decision block 1010 the data read (e.g., strobed-in) at process block 1005 is compared with the expected data for the specific bit number received.

If at decision block 1010 there is a match between the data read and the expected data, then execution continues to decision block 1015. At decision block 1015, if the delay adjustments are complete, for example, when the search process 1000 has found an edge of a data bit number with a selected strobe, then the search process 1000 is exited. At decision block 1015, if the delay adjustments are not complete, for example, when the search process 1000 is still searching for an edge of a data bit number with a selected strobe, then the search process 1000 continues to process block 1020. At process block 1020 an "edge to search" parameter is received, for example, the left edge 700B, 900B or the right edge 700D, 900D, with reference to FIGS. 7 and 9. The strobe delay may be adjusted based on a search algorithm and the "edge to search" parameter. The search algorithm may include a linear incremental delay sequence, or a binary sequence, for example. Execution then continues to process block 1005.

If at decision block 1010 there is not a match between the data read and the expected data, then execution continues to decision block 1025. Non-matching data may represent the extent of the data-valid window. In an illustrative example, as the strobe moves from "just inside" the data-valid window to a point that is "just outside" the data valid window, the sent data and received data begin to diverge (e.g., not match).

At decision block 1025, if the delay adjustments are complete, for example, when the search process 1000 has found an edge of a data bit number with a selected strobe, then the search process 1000 is exited. At decision block 1025, if the delay adjustments are not complete, for example, when the search process 1000 is still searching for an edge of a data bit number with a selected strobe, then the search process 1000 continues to process block 1030. At process block 1030 the "edge to search" parameter is received. The strobe delay may be adjusted based on the search algorithm and the "edge to search" parameter. Execution then continues to process block 1005.

In an illustrative example, a series of data bits sent during each of a series of D1 data-valid windows may be 1, 0, 1, 1, 0, 0. The search process 1000 reads a series of data strobed on a DQST strobe as 1, 0, 1, 1, 0, 0. The search process 1000 determines that the DQST strobe is within the D1 data-valid window because what is read matches what is sent. The search process 1000 then increases the delay on the DQST strobe. The search process 1000 reads a series of data strobed on a DQST strobe as 1, 1, 1, 0, 0, 0. The search process 1000 determines that the DQST strobe is outside the D1 data-valid window because what is read does not match what is sent. Accordingly, the search process 1000 continues to "hunt" for a temporal limit (e.g., edge) of the D1 data-valid window by strategically changing the strobe delay, reading the strobed data and determining which adjacent time delays produce a strobe with opposite matching results (e.g., "matching" next to "not matching").

Figure 11:
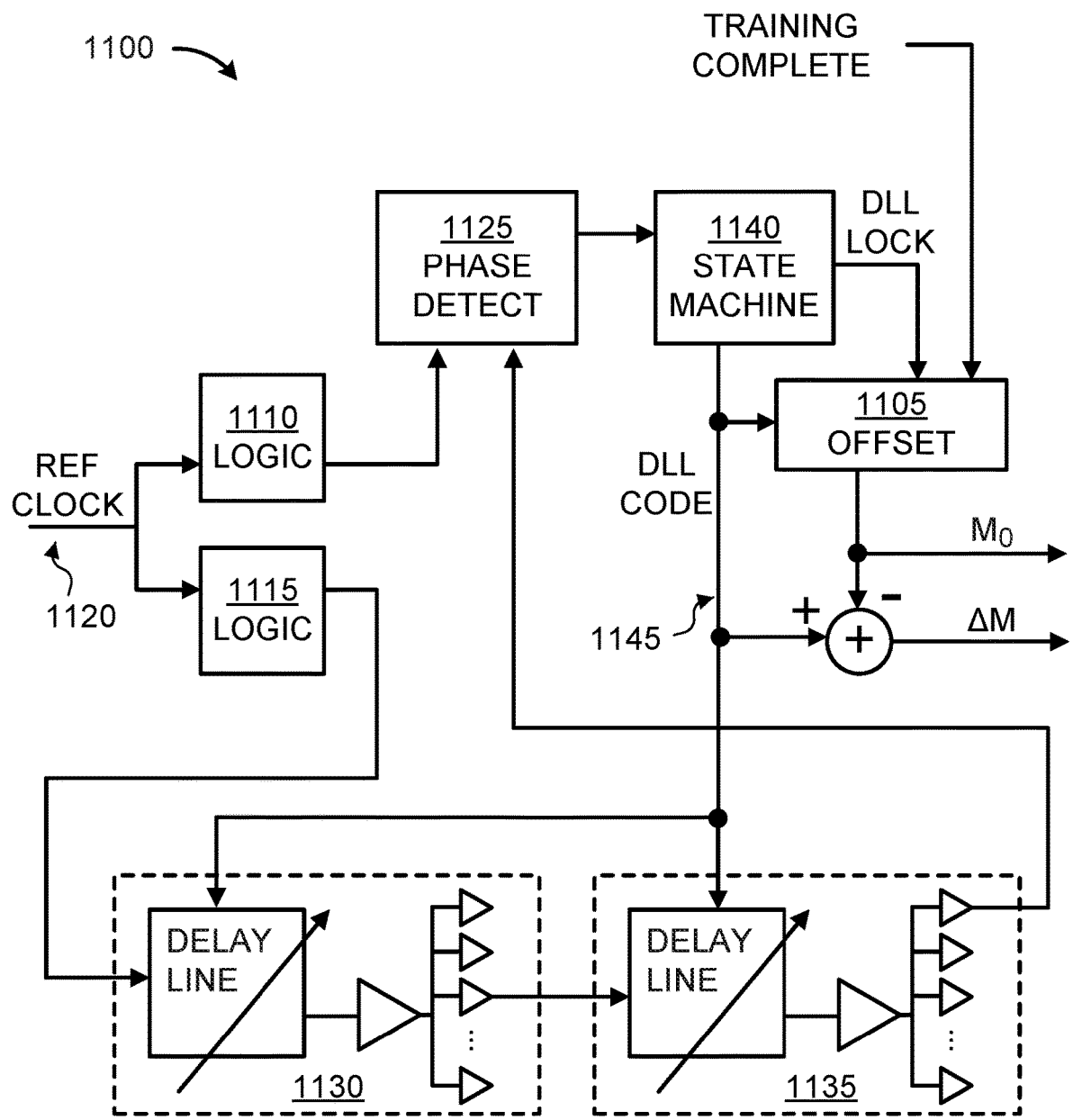
FIG. 11 depicts an exemplary delay-locked loop (DLL).

FIG. 11 depicts an exemplary delay-locked loop (DLL). A DLL control loop 1100 may be a tracking block and may be used in combination with a deserializer block, such as the deserializer block 200 (FIG. 2) which may be a training method implementation as described with reference to FIGS. 5-10. The deserializer block 200 may learn a set of delays which, when applied to a set of strobes, may substantially center the strobes within a temporal data-valid window. At the completion of training, with reference to FIG. 2, the TRAINING COMPLETE signal latches the DLL code M0.

In various examples, over a range of temperatures and voltages, the adjustable delay lines 250A and 250B may experience shifts in phase delay. In some examples, passage of time (e.g., aging) may cause the adjustable delay lines 250A and 250B to experience shifts in phase delay. The DLL control loop 1100 may detect these phase delay shifts and may provide a phase delay compensation ΔM to the deserializer block 200.

The DLL control loop 1100 includes a logic block 1110 and a logic block 1115. The logic blocks 1110 and 1115 may be matched in order to provide substantially the same phase delays through their circuitry. The logic blocks 1110 and 1115 are operably coupled on an input to a reference clock 1120. The logic block 1110 is operably coupled on an output to an input of a phase detection circuit 1125. The phase detection circuit 1125 receives the direct output of the logic block 1110 and receives an output of a series connected pair of ADCDBs 1130 and 1135. The series connected pair of ADCDBs 1130 and 1135 are coupled on an input of the ADCDB 1130 to an output of the logic block 1115. In order for the phase detection circuit 1125 to receive signals with substantially equal phases, the pair of ADCDBs 1130 and 1135 may provide a combined phase shift of 360 degrees. As the phase of the adjustable delay lines 250A and 250B (FIG. 2) shift over temperature, voltage and/or time, the phase of the ADCDBs 1130 and 1135 may shift a substantially equal temporal amount. Accordingly, the phase detection circuit 1125 may detect the phase shift of the adjustable delay lines 250A and 250B (FIG. 2).

The phase detection circuit 1125 is operably coupled on an output to an input of a state machine 1140. The state machine 1140 closes the DLL control loop 1100 and is operable to generate a DLL code 1145 in response to a phase difference generated by the phase detection circuit 1125. An output generating the DLL code 1145 is operably coupled to an input of each of the ADCDBs 1130 and 1135. The DLL code 1145 represents the delay determined by the DLL control loop 1100 to operate the ADCDBs 1130 and 1135 at 180 degrees phase shift (e.g., 360 degrees combined phase shift).

Accordingly, the 360-degree phase shift on the ADCDBs 1130 and 1135 may be substantially equal to one period of the input reference clock 1120. The DLL control loop 1100 is operable to maintain a 180-degree reference clock phase delay through each of the ADCDBs 1130 via the DLL code 1145. In an illustrative example, when the frequency of the reference clock 1120 is at twice a memory clock frequency, the DLL control loop 1100 is operable to maintain a 90-degree memory clock phase delay through each of the ADCDBs 1130 and 1135 via the DLL code 1145.

The ADCDBs 1130 and 1135 may be replicas of the ADCDBs 240 and 245 of FIG. 2. As replicas, the ADCDBs 1130 and 1135 may track the phase delays in the deserializer 200. Accordingly, as the phase delays are detected by the DLL control loop 1100, the phase delay compensation ΔM may be sent to the deserializer block 200 such that the strobes remain substantially centered within their associated data-valid windows.

During a training phase, the DLL control loop 1100 may provide the phase information (e.g., offset, compensation) to the deserializer block 200. When both the DLL control loop 1100 receives a positive TRAINING COMPLETE signal from the deserializer block 200 and when the DLL control loop 1100 is in DLL lock as indicated by the DLL LOCK signal from the DLL control loop 1100, then the current DLL code 1145 is captured by an offset latch 1105. The offset latch 1105 captures the current DLL code 1145 and generates the baseline phase delay offset $M_0$. The offset latch 1105 may provide the baseline phase delay offset $M_0$ to the deserializer block 200. The DLL control loop 1100 with its replica ADCDBs 1130 and 1135 then tracks the phase shifts in a run mode, which is the time forward after the training mode. The deserializer block 200 may use the phase delay compensation ΔM to maintain the strobes in the center of the data-valid windows. In various examples, offset may be added to account for any systematic mis-match between the adjustable delay lines 250A, 250B (FIG. 2) and ADCDBs 1130 and 1135.

In some examples, the DLL control loop 1100 may include one or more replica ADCDBs. For example, the pair of replica ADCDBs 1130 and 1135 may be replaced by four replica ADCDBs, each replica may provide a quarter of a reference clock period. Additional ADCDBs may advantageously allow slower reference clocks. Fewer ADCDBs may be advantageously implemented in smaller areas.

Figure 12:
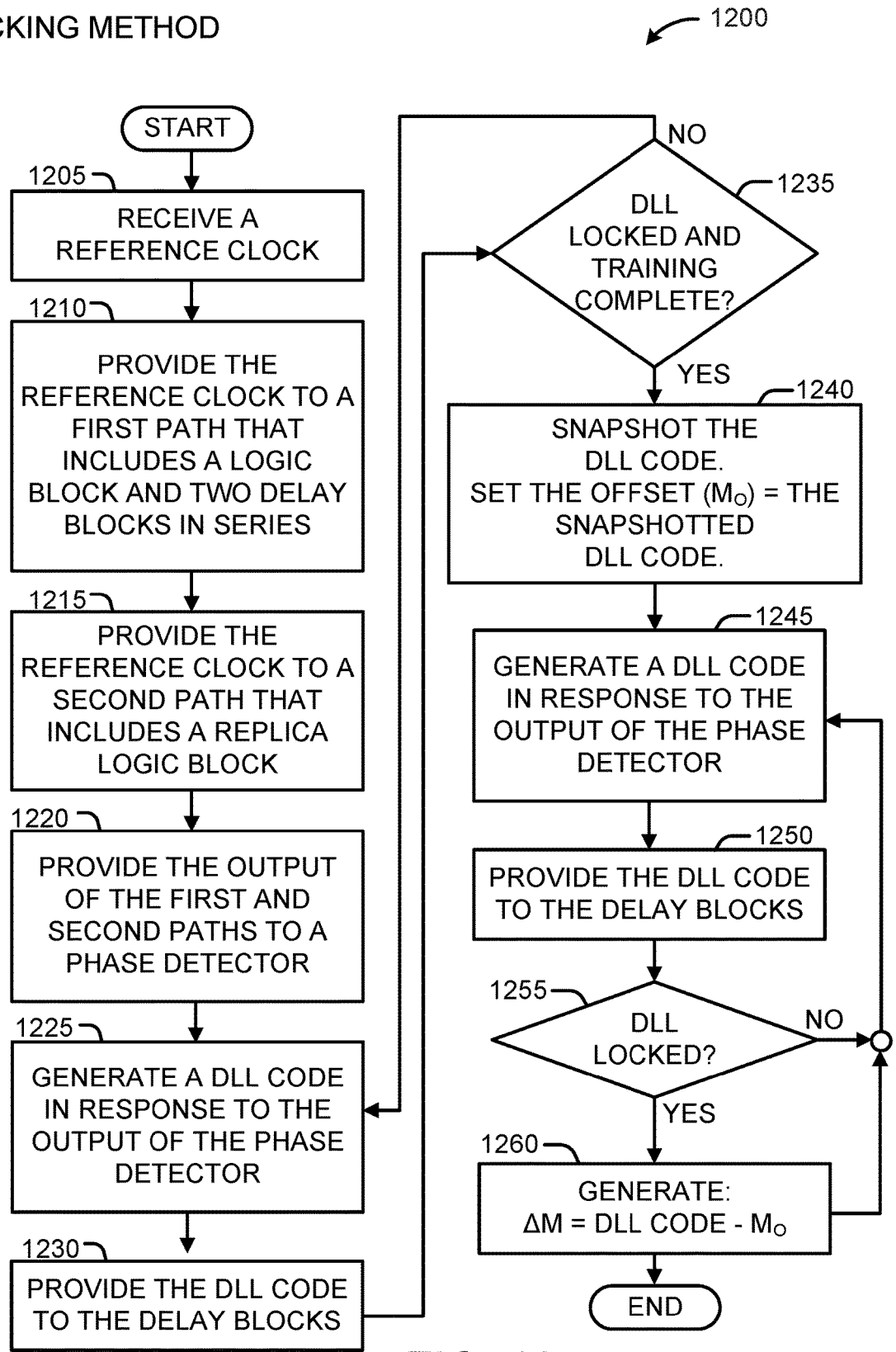
FIG. 12 depicts a flowchart of an exemplary tracking process.

FIG. 12 depicts a flowchart of an exemplary tracking process. A tracking process 1200 may be suitable for some embodiments, for example, for the DLL control loop 1100 (FIG. 11). The tracking process 1200 begins at process block 1205. The process block 1205 receives a reference clock. Next, a process block 1210 provides the reference clock to a first path that includes a logic block and two delay blocks in series. Next, a process block 1215 provides the reference clock to a second path that includes a replica logic block. Next, a process block 1220 provides the output of the first and second paths to a phase detector. Next, a process block 1225 generates a DLL code in response to the output of the phase detector. Next, a process block 1230 provides the DLL code to the delay blocks.

After completion of process block 1230, the tracking process 1200 continues to decision block 1235. If, at decision block 1235, the DLL is not locked or the training is not complete, then execution jumps back to process block 1225. If, at decision block 1235, the DLL is locked and the training is complete, then execution continues to process block 1240. At process block 1240 the current DLL code is captured (e.g., snapshotted). The captured DLL code is the initial phase delay offset $M_0$. Completion of the execution of the process block 1240 may indicate the completion of a training phase.

After completion of process block 1240, the tracking process 1200 continues to process block 1245. Process block 1245 generates a DLL code in response to the output of the phase detector. Next, process block 1250 provides the DLL code to the delay blocks. Next, decision block 1255 determines phase lock. If the DLL is not phase locked, then execution jumps back to process block 1245. If the DLL is in phase lock, then execution continues to process block 1260. At process block 1260 the initial phase delay offset $M_0$ is subtracted from the current DLL code. The result is the phase delay compensation ΔM.

With reference to FIG. 2, the strobe delay adjustments to Sc and ST may be determined as functions of phase delay offset $M_0$ and phase delay compensation ΔM:

$$\Delta S_T = \Delta M * \left(1 + \frac{S_{T0} - M_0}{T_0}\right)$$

$$\Delta S_C = \Delta M * \left(1 + \frac{S_{C0} - M_0}{T_0}\right)$$

Where:
The initial DQST strobe delay $S_{T0}$ is:

$$S_{T0} = TA - \frac{1}{2}(TC - TB')$$

The initial DQSC strobe delay $S_{C0}$ is:

$$S_{C0} = TB - \frac{1}{2}(TD - TA')$$

The middle of the average of the even and odd data-valid windows, $T_0$ is:

$$T_0 = \frac{1}{2} * UI = \frac{1}{2} * \text{Average}(TD - TA', TC - TB')$$

Where UI is a unit interval.

Although various embodiments have been described with reference to the figures, other embodiments are possible. For example, some embodiments may describe methods to train read DQS strobe delay lines in DDR memory systems in order to accurately place the read DQS strobes in the center of data windows. After completion of training, the accuracy of the read DQS strobe positions may be maintained with a DLL control loop. The DLL control loop may monitor timing variations due to voltage and temperature (VT) shifts. VT tracking may scale and adjust the read DQS strobe delay line(s) based on DLL control loop outputs.

In some examples, the delays described may be characterized by time. In some examples, the delays may be characterized by a number of "taps" or by a "tap number." The taps may refer to a series of connection points between serially linked delay subcircuits.

Some embodiments may separately optimize strobe placement within substantially unequal data-valid windows as may exist in various double data rate memory (DDR memory) interfaces. For example, separate optimization of odd and even data strobe placement may advantageously lower system jitter performance. Various embodiments may be suitable to determine separate strobes in systems producing unbalanced system clock duty cycles. For example, some embodiments may optimize systems with clock duty cycle ratios of about 51/49, 52/48, 53/47, 54/46, 55/45, 56/44, 57/43, 58/42, 59/41 or up to about 60/40 or higher.

In various examples, strobing may be implemented with a single clock. For example, falling edge-triggered DDR capture flops may be used for odd data, and rising edge-triggered DDR capture flops may be used for even data.

In some implementations, various DLL control loops may employ one or four delay replicas. In a 1 GHz memory clock example, if a DLL control loop employs a single replica delay line, then the reference clock frequency may be 4 GHz. In a 1 GHz memory clock example, if a DLL control loop employs four replica delay lines, then the reference clock frequency may be 1 GHz.

Various examples described may be implemented, for example, in high bandwidth memories (HBMs). Some described examples may be suitable for double data rate memories (DDR memories).

Although, for ease of description, various examples have been described as positioning the strobe substantially in the center of a data valid window, other implementations are possible. For example, in some embodiments, the predetermined optimal location may be adjusted to be located at between about 25% and about 75% of the data-valid window, such as about 30%, 35%, 40%, 45%, 49%, 49.5%, 49.9%, 50.1%, 50.5%, 51%, 55%, 60%, 65%, or about 70%. In some implementations, the predetermined optimal location for the even bits may be independently controlled to be different than the predetermined optimal location for the odd bits. By way of example and not limitation, at a given operating point at a particular time, the predetermined optimal temporal positions for the even and odd bits may be at 47.2% and 56.9% (or their equivalent tap locations) within their respective data-valid windows. In various embodiments, the predetermined optimal locations for any of the even or odd bits may be dynamically adjusted based on conditions, such as operating temperature or data type (e.g., video, voice, numerical operations, database) or as necessary based on the type of interface drivers and their signal transition characteristics and/or propagation delays.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs (Field Programmable Gate Arrays), for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various embodiments, a computer system may include non-transitory data storage in one or more locations in a data storage device, e.g. a memory. The memory may be connected to the one or more processors and may be configured for storage and retrieval of encoded data and/or computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Unless otherwise indicated or otherwise apparent to a person of ordinary skill in the art, clock signals may be generally understood to activate functionality (e.g., flip-flops 225, 230, 260) on a rising edge of a digital waveform rather than a negative falling edge. As has been described, various embodiment may deserialize the DDR waveform (e.g., DQx) to extract data associated with both positive and negative edges of the strobe signal, which may correspond to the positive edges of complementary signals DQST 210, DQSC 215.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A 1-to-2 memory interface deserializer apparatus (200), the apparatus comprising:
    a first adjustable delay line (250A) configured to delay a first strobe signal (DQST) in response to a ST delay control signal;
    a second adjustable delay line (250B) configured to delay a second strobe signal (DQSC) in response to a SC delay control signal, wherein the DQSC is substantially complementary to the DQST;
    an even flip-flop (230) coupled to receive a serial data stream (DQx), wherein the DQx comprises alternating even bits associated with an activating edge of the DQST, and odd bits associated with an activating edge of the DQSC;
    an odd flip-flop (225) configured to sample the odd bits from the serial data stream in response to the activating edge of the delayed DQSC received from the second adjustable delay line (250B); and,
    a processor circuit (265) operatively coupled to the even flip-flop (230), the odd flip-flop (225), and to the first and second adjustable delay lines (250A, 250B),
    wherein, during a training mode, the processor circuit (265) is configured to determine a temporal size and position of a valid data window for both of the sampled even bits and the sampled odd bits, respectively, and to generate the SC control signal and the ST control signal to selectively position the activating edge of the delayed DQST in the valid data window of the sampled even bits, and to selectively position the activating edge of the delayed DQSC in the valid data window of the sampled odd bits.

2. The apparatus of claim 1, wherein the processor is configured to independently generate the ST control signal and the SC control signal.

3. The apparatus of claim 1, further comprising a data input buffer (220) operatively coupled to the even flip-flop (230) and to the odd flip-flop (225), and configured to receive the DQx.

4. The apparatus of claim 1, wherein the processor circuit (265) is further configured to make the valid data window temporal size and position determinations relative to the strobe signal.

5. The apparatus of claim 1, further comprising a strobe input buffer (235) coupled to receive the DQST and the DQSC, wherein the strobe input buffer (235) comprises a differential buffer.

6. The apparatus of claim 1, further comprising an even synchronization flip-flop (260) coupled to the even flip-flop (230) and configured to sample the even bits in response to the activating edge of the delayed DQSC received from the second adjustable delay line (250B).

7. The apparatus of claim 3, wherein the processor circuit (265) operatively coupled to the even flip-flop (230) further comprises the processor circuit (265) coupled to the even synchronization flip-flop (260), and the processor circuit (265) configured to monitor the even data bits further comprises the processor circuit (265) configured to receive the synchronized even bits from the even synchronization flip-flop (260).

8. The apparatus of claim 1, wherein the received serial data stream is generated from a double data rate (DDR) memory interface.

9. The apparatus of claim 1, wherein the DQx comprises a predetermined pseudo-random sequence, and the processor circuit (265) is further configured to determine whether a predetermined number of the sampled even data bits matches corresponding bits of the predetermined pseudo-random sequence.

10. A method of operating a 1-to-2 memory interface deserializer apparatus (200), the method comprising:
    delaying, with a first adjustable delay line (250A), a first strobe signal (DQST) in response to a ST delay control signal;
    delaying, with a second adjustable delay line (250B), a second strobe signal (DQSC) in response to a SC delay control signal, wherein the DQSC is substantially complementary to the DQST;
    receiving, with an even flip-flop (230), a serial data stream (DQx), wherein the DQx comprises alternating even bits associated with an activating edge of the DQST, and odd bits associated with an activating edge of the DQSC;
    sampling, with an odd flip-flop (225), the odd bits from the serial data stream in response to the activating edge of the delayed DQSC received from the second adjustable delay line (250B);
    providing a processor circuit (265) operatively coupled to the even flip-flop (230), the odd flip-flop (225), and to the first and second adjustable delay lines (250A, 250B); and,
    during a training mode, determining, with the processor circuit (265), a temporal size and position of a valid data window for both of the sampled even bits and the sampled odd bits, respectively, and
    generating the SC control signal and the ST control signal to selectively position the activating edge of the delayed DQST in the valid data window of the sampled even bits, and to selectively position the activating edge of the delayed DQSC in the valid data window of the sampled odd bits.

11. The method of claim 10, further comprising independently generating the ST control signal and the SC control signal.

12. The method of claim 10, further comprising providing a data input buffer (220) operatively coupled to the even flip-flop (230) and to the odd flip-flop (225), and configured to receive the DQx.

13. The method of claim 10, further comprising determining, with the processor circuit (265), the valid data window temporal size and position determinations relative to the strobe signal.

14. The method of claim 10, further comprising providing a strobe input buffer (235) coupled to receive the DQST and the DQSC, wherein the strobe input buffer (235) comprises a differential buffer.

15. The method of claim 10, further comprising sampling, with an even synchronization flip-flop (260) coupled to the even flip-flop (230), the even bits in response to the activating edge of the delayed DQSC received from the second adjustable delay line (250B).

16. The method of claim 15, wherein the processor circuit (265) operatively coupled to the even flip-flop (230) further comprises the processor circuit (265) coupled to the even synchronization flip-flop (260), and receiving, with the processor circuit (265), the synchronized even bits from the even synchronization flip-flop (260).

17. The method of claim 10, wherein the DQx comprises a predetermined pseudo-random sequence, and determining, with the processor circuit (265), whether a predetermined number of the sampled even data bits matches corresponding bits of the predetermined pseudo-random sequence.

18. A 1-to-2 memory interface deserializer apparatus (200), the apparatus comprising:
- a first adjustable delay line (250A) configured to delay a first strobe signal (DQST) in response to a ST delay control signal;
- a second adjustable delay line (250B) configured to delay a second strobe signal (DQSC) in response to a SC delay control signal, wherein the DQSC is substantially complementary to the DQST;
- an even flip-flop (230) coupled to receive a serial data stream (DQx), wherein the DQx comprises alternating even bits associated with an activating edge of the DQST, and odd bits associated with an activating edge of the DQSC;
- an odd flip-flop (225) configured to sample the odd bits from the serial data stream in response to the activating edge of the delayed DQSC received from the second adjustable delay line (250B); and,
- means for generating the time delay to place DQST in the middle of an even data window, and generating the time delay to place DQSC in the middle of an odd a data window.

19. The apparatus of claim 18, further comprising means for determining a time duration of the even data window.

20. The apparatus of claim 19, further comprising means for determining a time a duration of the odd data window.

\* \* \* \* \*